(12) United States Patent
Takahashi et al.

(10) Patent No.: US 6,192,828 B1
(45) Date of Patent: Feb. 27, 2001

(54) THIN FILM FORMING DEVICE FOR FORMING SILICON THIN FILM HAVING CRYSTALLINITY

(75) Inventors: Eiji Takahashi; Hiroya Kirimura, both of Kyoto (JP)

(73) Assignee: Nissin Electric Co., Ltd., Kyoto (JP)

( * ) Notice: Subject to any disclaimer, the term of this patent is extended or adjusted under 35 U.S.C. 154(b) by 0 days.

(21) Appl. No.: 09/306,990

(22) Filed: May 7, 1999

(30) Foreign Application Priority Data

May 8, 1998 (JP) .................................................. 10-142274

(51) Int. Cl.[7] .............................. C23C 16/00; H05H 1/00
(52) U.S. Cl. .............................. 118/723 E; 118/723 MW; 118/725; 156/345
(58) Field of Search ....................... 118/723 E, 723 MW, 118/725, 723 ER, 723 IR, 719; 156/345; 315/111.01, 111.91, 111.21, 111.81

(56) References Cited

U.S. PATENT DOCUMENTS

| | | | |
|---|---|---|---|
| 4,828,369 | * 5/1989 | Hotomi ................................. | 350/357 |
| 5,302,424 | 4/1994 | Murai et al. ......................... | 427/131 |
| 5,968,275 | * 10/1999 | Lee et al. ..................... | 118/723 MW |
| 6,050,217 | * 4/2000 | Li ...................................... | 118/723 E |

FOREIGN PATENT DOCUMENTS

| | | |
|---|---|---|
| 6-45254 | 2/1994 | (JP) . |
| 9-251958 | 9/1997 | (JP) . |

* cited by examiner

Primary Examiner—Gregory Mills
Assistant Examiner—P. Hassanzadel
(74) Attorney, Agent, or Firm—Finnegan, Henderson, Farabow, Garrett & Dunner, L.L.P.

(57) ABSTRACT

An insulating member is interposed between a film formation chamber container and a plasma chamber container. Both containers are adjacent to and communicated with each other. In the film formation chamber container, a base material holder is provided for holding the base material. Raw material gas is introduced into the plasma chamber container and ionized by high frequency electric discharge, to generate plasma. A high frequency electrode and a high frequency electric power source are provided as a plasma generating unit. There is provided a porous electrode 30, the electric potential of which is the same as that of the plasma chamber container 24, between both chambers 22, 24 to partition both chambers. A pulse electric powder source for impressing bipolar pulse voltage, in which a positive polarity portion and a negative polarity portion are alternately repeated, is provided between the base material holder and both of the plasma chamber container and the porous electrode 30, the electric potential of which is the same as that of the plasma chamber container 24.

16 Claims, 5 Drawing Sheets

PRIOR ART

THIN FILM FORMING DEVICE FOR FORMING SILICON THIN FILM HAVING CRYSTALLINITY

BACKGROUND OF THE INVENTION

1. Filed of the Invention

The present invention relates to a thin film forming device for forming a thin film on a base material by the plasma CVD (Chemical Vapor Deposition) method. More particularly, the present invention relates to the device capable of forming an excellently crystalline thin film without heating a base material to high temperature.

2. Description of the Related Art

In order to manufacture a thin film transistor (TFT) for composing a liquid crystal display, a semiconductor integrated circuit or a solar battery, a thin crystalline film is formed on a base material, for example, a thin silicon film is formed on the base material.

One of the means for forming the thin crystalline film is the plasma CVD method. According to the plasma CVD method, raw material gas is decomposed in plasma so that a thin film is formed on the base material. Therefore, the plasma CVD method is advantageous in that the base material can be kept at a relatively low temperature.

Figure 5:
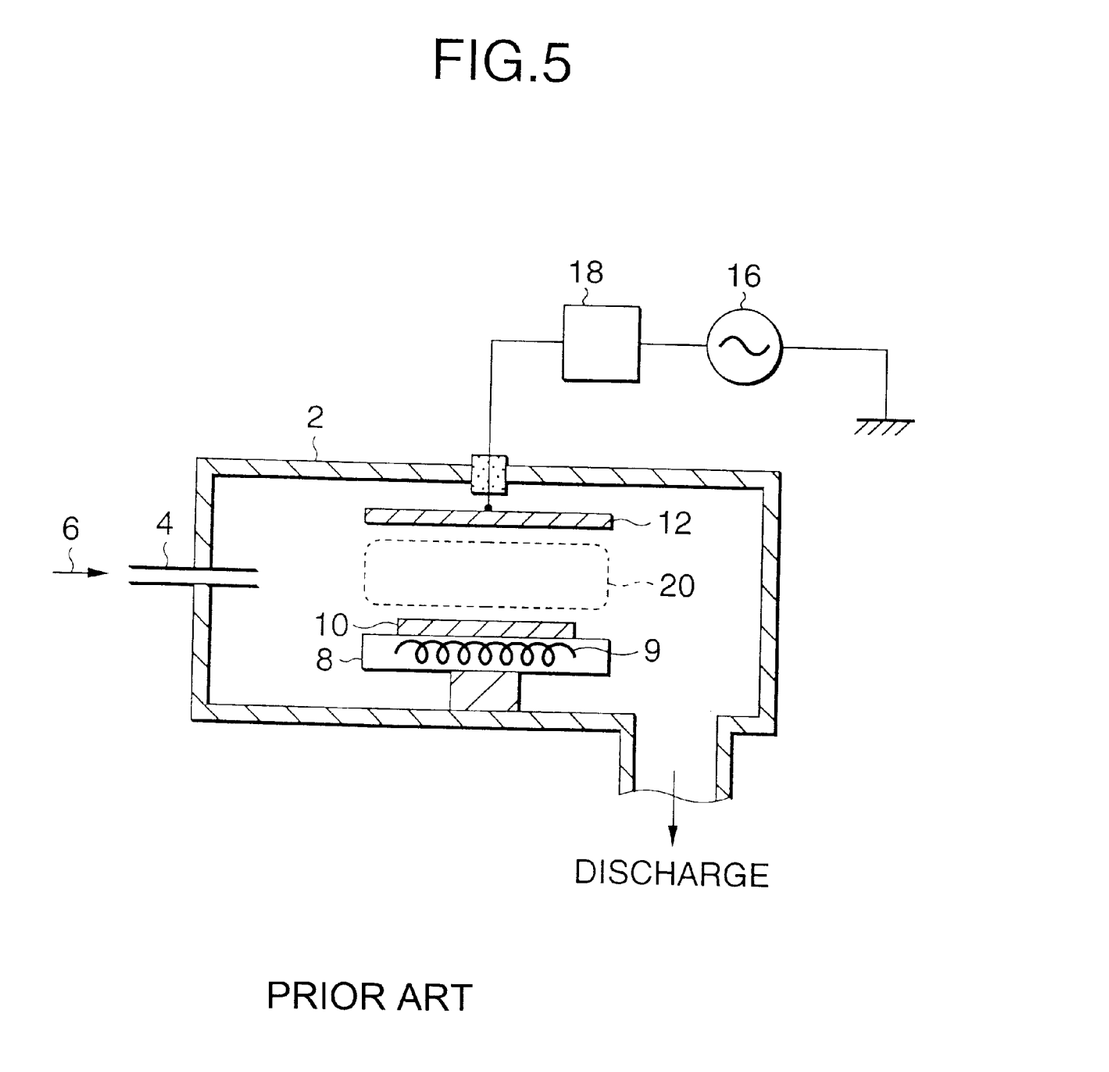
FIG. 5 is a cross-sectional view showing an example of a conventional thin film formation device.

FIG. 5 is a view showing a conventional example of a thin film forming device to which the plasma CVD method is applied. In a reaction chamber container 2, from which gas is exhausted to vacuum by a vacuum exhauster not shown in the drawing, there are provided a base material holder 8 for holding a base material 10, and a high frequency electrode 12 which are opposed to each other. In the base material holder 8, a heater 9 is provided for heating the base material. Raw material gas 6 such as silane ($SiH_4/H_1$) diluted by hydrogen is introduced into the reaction chamber container 2 via a gas introduction pipe 4. Electric power of high frequency is supplied between the high frequency electrode 12 and the base material holder 8 from a high frequency electric power source 16 via a matching circuit 18.

When the raw material gas 6 is introduced and the electric power of high frequency is supplied as described above, electric discharge of high frequency is generated between the high frequency electrode 12 and the base material holder 8. By this electric discharge of high frequency, the raw material gas 6 is ionized and plasma 20 is generated. The raw material gas 6 is decomposed in this plasma 20, and a thin film is formed on the base material 10, for example, a thin film of silicon is formed on the base material 10.

In the above thin film formation device, the plasma CVD method is used. Therefore, it is possible to keep the base material at a relatively low temperature. However, in order to form a thin crystalline film, it is necessary to heat the base material 10 to at least 900° C. by the heater 9. Therefore, the base material 10 must withstand this temperature. For the above reasons, a type of the base material 10 is limited. For example, glass of a low softening point such as soda glass or non-alkali glass, the softening point of the former is approximately 400° C. and the softening point of the latter is approximately 700° C., is not expensive. However, it is impossible to use the above glass of a low softening point in the conventional device.

Further, since the base material 10 is directly exposed to the plasma 20, ions existing in the plasma 20 having energy of various intensities are incident on a surface of the base material 10. The ions having energy of various intensities are incident on the base material 10, and the ions are always incident in the process of film formation. Consequently, an excessively large quantity of ions are incident on the base material 10. Therefore, growth of crystals of the thin film formed on the base material is obstructed, and damage (defect) is caused on the film, that is, it is difficult to form an excellently crystalline thin film.

SUMMARY OF THE INVENTION

It is an object of the present invention to provide a thin film formation device capable of forming an excellently crystalline thin film without heating a base material to high temperature.

A thin film forming device for forming a silicon thin film having crystallinity according to the present invention comprises: a film formation chamber container from which gas is exhausted to vacuum; an insulating member; a plasma chamber container which is adjacent to the film formation chamber container via the insulating member so that the plasma chamber container is insulated from the film formation chamber container and is communicated with the film formation chamber container, at least one of raw material gas and a mixture gas containing raw material gas and inert gas being introduced into the plasma chamber container; plasma generation means for generating plasma in the plasma chamber container by ionizing the introduced raw material gas; a porous electrode having small pores arranged to partition the plasma chamber container and the film formation chamber container from each other, the electric potential of the porous electrode being the same as that of the plasma chamber container; a base material holder for holding a base material so that the base material can be directed to the porous electrode, the base material holder being arranged in the film formation chamber container to be opposed to the porous electrode; and a pulse power source for impressing a bipolar pulse voltage, in which a positive polarity portion and a negative polarity portion are alternately repeated, between the base material holder and both of the plasma chamber container and the porous electrode of the same electric potential as that of the plasma chamber container.

DETAILED DESCRIPTION OF THE INVENTION

The present invention will be described in detail referring to the accompanying drawings.

A thin film forming device for forming a silicon thin film having crystallinity according to the present invention has a film formation chamber container, a plasma chamber container, a plasma generation unit, a porous electrode, a base material holder and a pulse power source. From the film formation chamber container, gas is exhausted to vacuum. The plasma chamber container is adjacent to the film formation chamber container via insulating member and communicated with the film formation chamber container. Raw material gas is introduced into the plasma chamber container. The plasma generation unit generates plasma in this plasma chamber container by ionizing the introduced raw material gas. The porous electrode is arranged in such a manner that the plasma chamber container and the film formation chamber container are partitioned from each other by the porous electrode. The electric potential of the porous electrode is the same as that of the plasma chamber container. The base material holder for holding a base material so that the base material can be directed to the porous electrode. The base material holder is arranged in the film formation chamber container in such a manner that the base material holder is opposed to the porous electrode. The pulse power source impresses a bipolar pulse voltage between the base material holder and both of the plasma chamber container and the porous electrode having the same electric potential. In the bipolar pulse voltage, positive polarity portion and a negative polarity portion are alternately repeated.

According to the above structure, the plasma chamber container in which plasma is generated is provided separately from the film formation chamber container in which the base material is housed and a film is formed on the base material. Further, the porous electrode is arranged between the plasma chamber container and the film formation chamber container so that both containers are partitioned from each other by the porous electrode. Due to the above arrangement, the base material arranged in the film formation chamber container can be prevented from being directly exposed to the plasma. Therefore, it is possible to prevent ions having energy of various intensities to be excessively incident on the base material.

In the plasma chamber container, when the plasma is generated by the plasma generation unit, raw material gas is decomposed and excited, and excited active species are made. Neutral species in these excited active species, for example, radicals are diffused into the film formation chamber container via the pores of the porous electrode and deposited on a surface of the base material holder, and a thin film can be formed.

On the other hand, ions (positive ions) are drawn out from the plasma in the plasma chamber container via the porous electrode during the positive polarity cycle of the pulse electric power source, when bipolar pulse voltage is impressed between the plasma chamber container and the porous electrode. Accordingly, ions can be intermittently irradiated on the base material and the thin film formed on the base material. Further, energy of these ions is substantially determined by the voltage of the positive polarity portion of the above bipolar pulse voltage. Accordingly, ions of the uniform intensity of energy can be irradiated on the base material. A quantity of ions incident on the base material can be controlled by the voltage of the positive polarity portion of the bipolar pulse voltage, the frequency and the rate of duty.

When the base material is irradiated with ions as described above, crystallization of the thin film formed on the base material can be facilitated. The reason why crystallization can be facilitated is that energy of the irradiated ions is given onto the film deposited on the base material so that the film can be excited. Consequently, even when the base material is not heated to high temperature, it is possible to form an excellently crystalline thin film.

Further, when the above bipolar pulse voltage is impressed, electrons can be drawn out from the above plasma in the negative polarity cycle, and the thus drawn electrons can be made to be incident on the base material. Accordingly, a positive electric charge accumulated on the surface of the base material by the irradiation of ions can be neutralized by the electrons. As a result, charge-up (electric charge) of the base material caused by the irradiation of ions can be suppressed. Due to the foregoing, ions incident on the base material can be prevented from being pushed back. That is, it is possible to prevent kinetic energy of ions from being decreased. Accordingly, it becomes possible for ions to be incident on the base material by a predetermined intensity of energy. Therefore, crystallization of a thin film can be more positively facilitated by the irradiation of ions.

Preferred embodiments of the present invention will be described as follows referring to the accompanying drawings.

Figure 1:
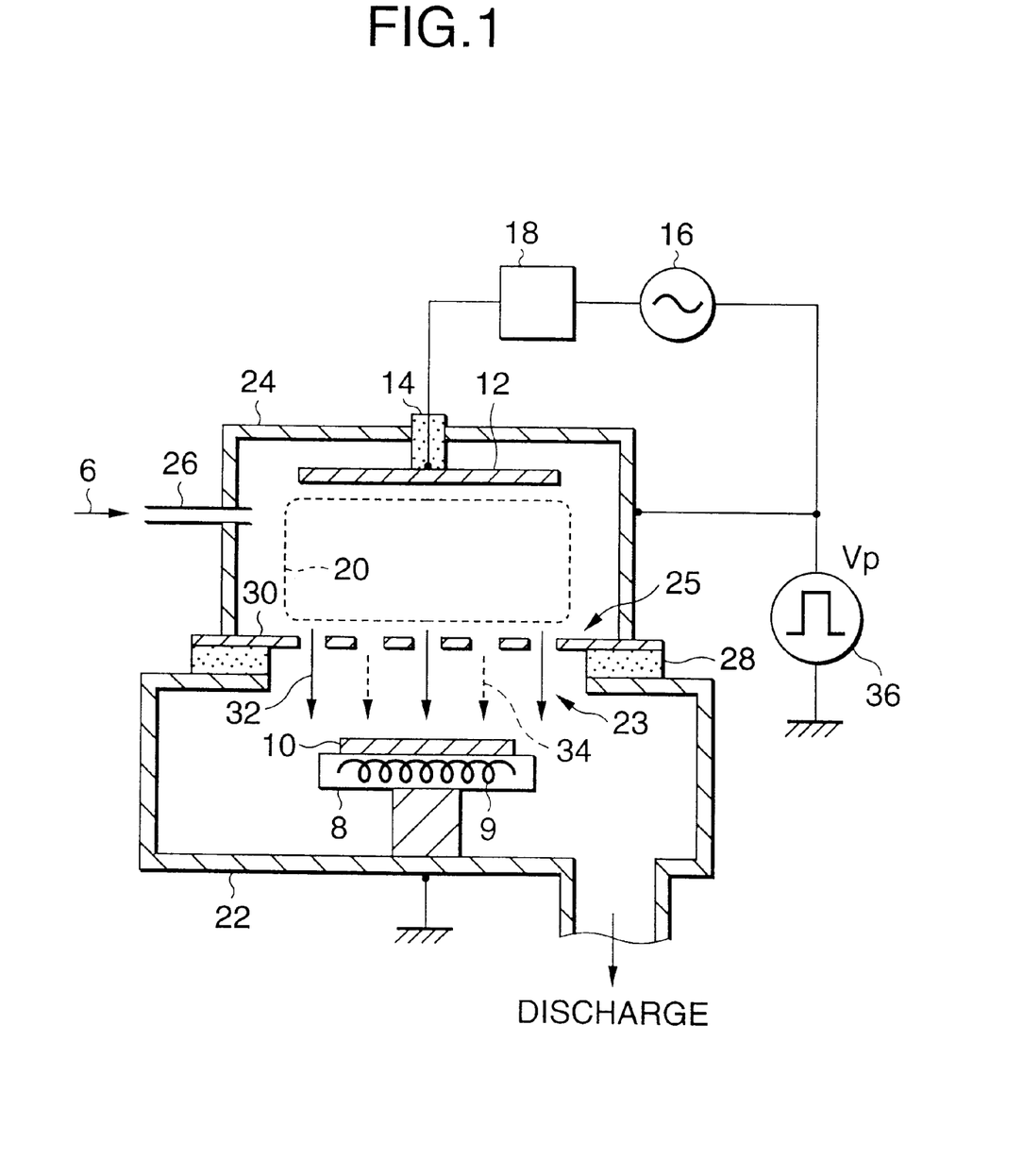
FIG. 1 is a cross-sectional view showing an embodiment of the thin film formation device of the present invention.

FIG. 1 is a cross-sectional view showing an embodiment of the thin film formation device of the present invention. The same reference characters are used to indicate the same parts or like parts in FIG. 1 and FIG. 5 which shows the conventional example. Different points from those of the conventional example will be mainly explained below.

This thin film formation device includes a film formation chamber container 22 from which gas is exhausted to vacuum (for example, $10^{-5}$ to $10^{-4}$ Torr) by a vacuum exhauster not shown in the drawing. In this embodiment, an opening 23 is formed on an upper face of this film formation chamber container 22. This film formation chamber container 22 is electrically grounded. Therefore, this film formation chamber container 22 is kept at an electric potential of ground.

In the film formation chamber container 22, a base material holder 8 is provided, which is directed to the opening 23. That is, the base material holder 8 is arranged being opposed to a porous electrode 30 described later. This base material holder 8 holds a base material 10 so that the base material 10 is directed to the porous electrode 30. In this embodiment, this base material holder 8 is composed of an electric conductor and electrically grounded. Therefore, this base material holder 8 is kept at an electric potential of ground. In the base material holder 8 or in the proximity of the base material holder 8, there is provided a heater 9 for heating the base material 10.

An annual insulating member 28 is interposed between the opening 23 of the film formation chamber container 22 and the plasma chamber container 24, wherein the plasma chamber container 24 is adjacent to the opening 23 of the film formation chamber container 22. In this embodiment, this plasma chamber container 24 is cylindrical, and an opening 25 is formed on a lower face of this plasma chamber container 24. The plasma chamber container 24 is communicated with the film formation chamber container 22 via this opening 25 and the above opening 23. Raw material gas 6 for forming a thin film is introduced into this plasma chamber container 24 via a gas introducing pipe 26. The raw material gas 6 is introduced so that pressure in the plasma chamber container 24 can be, for example, $10^{-2}$ to $10^{-4}$ Torr.

The raw material gas 6 contains an element for composing a thin film to be formed on the base material 10. For example, when a thin film of silicon is formed, silane ($SiH_4$) or silane ($SiH_4/H_2$) diluted by hydrogen is used as the raw material gas 6. Mixed gas in which the raw material gas 6 and inert gas such as Ar or Ne are mixed with each other may be introduced into the plasma chamber container 24.

Consequently, ions of inert gas can be irradiated onto the base material together with ions of the element composing the raw material gas. In this case, no ions of inert gas compose the thin film. Therefore, only kinetic energy of the ions of inert gas can be utilized for facilitating crystallization of the thin film.

This embodiment includes a plasma generation unit for generating plasma 20 by ionizing the raw material gas 6 in the plasma chamber container 24 by a high frequency electrode 12 and high frequency electric power source 16. That is, the high frequency electrode 12, which is electrically insulated from the plasma chamber container 24, is arrange din the plasma chamber container 24. Reference numeral 14 designates an electrically insulating member. In this embodiment, the high frequency electrode 12 is formed into a plate-shape and arranged at a position close to a ceiling of the plasma chamber container 24. The high frequency electric power source 16 is connected between the high frequency electrode 12 and the plasma chamber container 24 via a matching circuit 18. High frequency electric power is supplied between the high frequency electrode 12 and the plasma chamber container 24 from the high frequency electric power source 16. Accordingly, high frequency electric discharge is caused between the high frequency electrode 12 and the plasma chamber container 24, so that the raw material gas 6 can be ionized in the plasma chamber container 24, and the plasma 20 can be generated. Examples of frequencies of the high frequency electric power are 13.56 MHz, 50 MHz and 60 MHz.

In the proximity of the opening 25 of the plasma chamber container 24, there is provided a porous electrode 30 having a large number of pores (small pores) in such a manner that the plasma chamber container 24 and the film formation chamber container 22 are partitioned from each other by the porous electrode 30. In the present invention, the diameter of the pores are preferably in the range of 0.1 to 10 mm. This porous electrode 30 is electrically connected with the plasma chamber container 24. Therefore, the electric potential of the porous electrode 30 is the same as that of the plasma chamber container 24. This porous electrode 30 may be a plate-shaped electrode having a large number of pores. Alternatively, this porous electrode 30 may be a net-shaped mesh electrode having a large number of pores. It is preferable to use the mesh electrode because a ratio of opening can be easily raised in the case of the mesh electrode.

Figure 3:
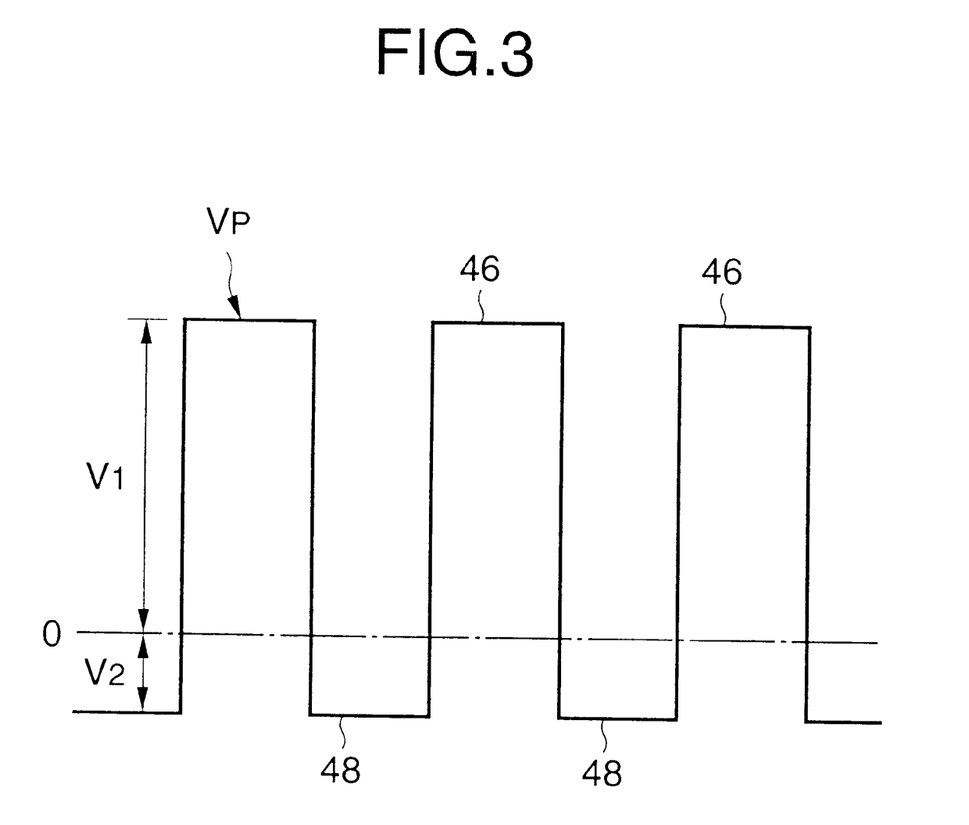
FIG. 3 is a view showing an example of a waveform of bipolar pulse voltage.

A pulse power supply 36 is connected between the plasma chamber container 24 and the ground and also between the porous electrode 30, the electric potential of which is the same as that of the plasma chamber container 24, and the ground. Therefore, bipolar pulse voltage $V_p$ can be impressed between the plasma chamber container 24 and the base material holder 8 and also between the porous electrode 30 and the base material holder 8 by the pulse power supply 36. For example, as shown in FIG. 3, bipolar pulse voltage $V_p$ is a pulse voltage in which a positive polarity portion 46 and a negative polarity portion 48 are alternately repeated. A preferable characteristic of this bipolar pulse voltage $V_p$ will be described later.

In this thin film formation device, the plasma chamber container 24 for generating the plasma 20 and the film formation chamber container 22 for housing the base material 10 and forming a film on the base material 10 are arranged separately from each other. Further, the porous electrode 30 is arranged for partitioning the plasma chamber container 24 and the film formation chamber container 22. Therefore, it is possible to substantially shut up the plasma 20 in the plasma chamber container 24, and it is possible to prevent the base material 10 in the from formation chamber container 22 from being directly exposed to the plasma 20. Consequently, it becomes possible to solve a conventional problem. That is, ions of various intensities of energy can be suppressed from being excessively incident on the base material 10.

When the plasma 20 is generated by the plasma generating unit in the plasma chamber container 24, the raw material gas 6 is decomposed and excited, so that excited active species are made. Neutral excited active species 32 in the thus made excited active species, for example, radicals (free atoms) are diffused into the film formation chamber container 22 via the pores formed in the porous electrode 30 and deposited on a surface of the base material 10 on the base material holder 8. In this way, a thin film is formed on the base material 10. For example, in the case where the raw material gas 6 is silane diluted by hydrogen as described above, the radicals such as $SiH_2{}^*$ and $SiH_3{}^*$, arrive at the base material 10 and are deposited. Therefore, a thin film of silicon can be formed. Therefore, it is preferable that the base material holder 8 and the base material 10 are arranged close to the porous electrode 30. According to the above arrangement, the excited active species 32 can easily arrive onto the base material 10, and the film formation speed can be raised.

On the other hand, when bipolar pulse voltage $V_p$ is impressed upon the plasma chamber container 24 and the porous electrode 30 by the pulse electric power source 36, ions (positive ions) 34 can be drawn out from the plasma 20 in the plasma chamber container 24 via the porous electrode 30 in a period of positive polarity cycle of pulse voltage $V_p$, that is, in a period of the positive polarity portion 46. Accordingly, the thus drawn ions 34 can be intermittently irradiated on the base material 10 and the thin film formed on the base material 10. Further, energy of these ions 34 is substantially determined by voltage $V_1$ (shown in FIG. 3) of the positive polarity portion 46 of bipolar pulse voltage $V_p$. Accordingly, the ions 34, the intensities of energy of which are uniform, can be irradiated on the base material 10. Of course, energy of the ions 34 irradiated on the base material 10 can be controlled by voltage $V_1$ of the positive electrode portion of the bipolar pulse voltage $V_p$. A quantity of ions 34 incident on the base material 10 can be controlled by voltage $V_1$ of the positive polarity portion of bipolar pulse voltage $V_p$, the frequency and the rate of duty. A quantity of ions 34 is proportional to 3/2 power of voltage $V_1$ of the positive polarity portion.

When the base material 10 is irradiated with ions as described above, crystallization of the thin film formed on the base material 10 can be facilitated. The reason why crystallization can be facilitated is that energy of the irradiated ions is given onto the film deposited on the base material 10 so that the film can be excited. As a result, even when the base material 10 is not heated to high temperature, which is unlike the conventional case, it is possible to form an excellently crystalline thin film. For example, even when the base material 10 is at a low temperature not higher than 400° C., it is possible to form a thin film of excellent polycrystallization silicon (p-Si) on the base material 10 at low cost. In the present invention, the base material is preferably heated at the temperature ranging from a room temperature to 400° C. As a result, a type of the base material 10 can be selected from a wide range. For example, it is possible to form an excellently crystalline thin film on an inexpensive base material such as glass of low softening point. It is possible to form an excellently crystalline thin film only by the film forming process. Therefore, it is possible to omit the two stage processing, which is used in the conventional case, in which heat treatment is conducted after film formation so as to facilitate crystallization. Therefore, the number of manufacturing processes can be reduced and productivity can be enhanced.

In this thin film formation device, the base material 10 can be irradiated with ions 34 before, in the middle and after film formation, and an intensity of energy of the ions 34 and species of the ions 34 can be arbitrarily selected at that time. Accordingly, it is possible to conduct surface excitation of a thin film, control of stress on a thin film, control of crystallization of a thin film, control of grain size of crystals, control of orientation of crystals and control of adhesive force, and the like, which are impossible for the conventional plasma CVD method.

Further, when the above bipolar pulse voltage $V_p$ is impressed, electrons can be drawn out from the above plasma 20 in the negative polarity cycle (in the period of the negative polarity portion 48), and the thus drawn electrons can be made to be incident on the base material 10. Accordingly, a positive electric charge accumulated on the surface of the base material by the irradiation of ions can be neutralized by the electrons. As a result, charge-up (electric charge) of the base material 10 caused by the irradiation of ions can be suppressed. Consequently, ions 34 incident on the base material 10 can be prevented from being pushed back. That is, it is possible to prevent kinetic energy of ions 34 from being decreased. Accordingly, it becomes possible for ions 34 to be incident on the base material 10 by a predetermined intensity of energy. Therefore, crystallization of a thin film can be more positively facilitated by the irradiation of ions. When the base material 10 is made of insulating member or an insulating thin film is formed on a surface of the base material 10, the surface of the base material 10 can be easily charged up. Therefore, when electrons are incident on the base material 10 as described above, it is possible to provide a remarkable effect.

It is preferable that the frequency of bipolar pulse voltage $V_p$ is in the range from 10 Hz to 1000 Hz. When the frequency is lower than 10 Hz, ion irradiation time to the base material 10 becomes long in the positive polarity cycle. Accordingly, the neutralizing action by electrons, which are incident in the negative polarity cycle, becomes insufficient. Therefore, charge-up of the base material 10 can not be effectively suppressed. When the frequency exceeds 1000 Hz, it is impossible for ions in the plasma 20 to follow such a quick change in electric potential. Therefore, it becomes difficult to draw out the ions 34 from the plasma 20 via the porous electrode 30. Accordingly, irradiation of ions onto the base material 10 becomes difficult.

Voltage $V_1$ of the positive polarity portion 46 of the above bipolar pulse voltage $V_p$ is preferably in the range from 100 V to 1000 V. When the voltage is lower than 100 V, an intensity of energy of the ions 34 to be drawn out becomes too low. Therefore, crystallization of the thin film obtained by ion irradiation can not be effectively facilitated. When the voltage exceeds 1000 V, energy of ion irradiation becomes too high, and damage is given to the thin film, and crystallization is lowered on the contrary.

Voltage $V_1$ of the negative polarity portion 48 of the above bipolar pulse voltage $V_p$ is preferably in the range from 5 V to 100 V. When the voltage is lower than 5 V, it becomes impossible to draw out electrons sufficiently from the plasma 20 via the porous electrode 30. Therefore, charge-up can not be effectively suppressed. When the voltage exceeds 100 V, negative charge-up voltage becomes too high when electrons are excessively incident on the base material 10, which causes a harmful effect.

A duty ratio of bipolar pulse voltage $V_p$ is preferably not lower than 50%. Due to the foregoing, ions can be mainly irradiated on the base material 10.

Figure 2:
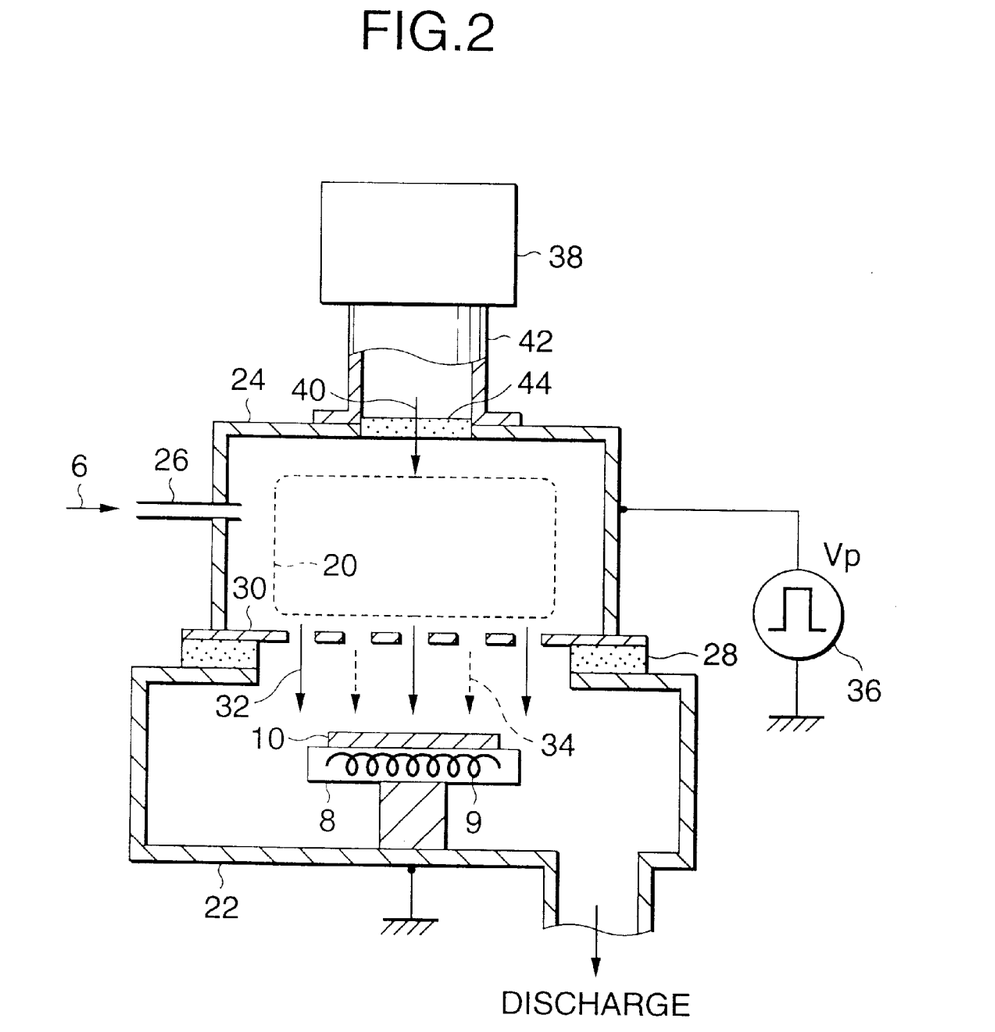
FIG. 2 is a cross-sectional view showing another embodiment of the thin film formation device of the present invention.

The plasma generating unit may be of a type in which microwaves are used as shown in FIG. 2. As can be seen in the example illustrated in FIG. 2, microwave 40, the frequency of which is 2.45 GHz, which have been outputted from a microwave electric power source 38, are introduced into the plasma chamber container 24 via a wave guide tube 42 and a dielectric window 44 (microwave introducing means). Accordingly, microwave electric discharge is caused in the plasma chamber container 24, and the raw material gas 6 is ionized so as to generate the plasma 20.

Although not shown in the drawing, the plasma generating unit may be composed in such a manner that ultraviolet rays or laser beams are introduced into the plasma chamber container 24 and the raw material gas 6 is excited by ultraviolet rays or laser beams so as to generate the plasma 20.

EXAMPLE

In this example, the device shown in FIG. 1 was used, and a thin film of silicon was formed on the base material 10 under the following conditions:

Frequency of high frequency electric power: 60 MHz

Introduced raw material gas: $SiH_4$ (50%)/$H_2$, 10 sccm

Introduced inert gas: Ar 5 sccm

Pressure in plasma chamber container: $1 \times 10^{-4}$ Torr

Voltage of positive polarity portion of pulse voltage: 500 V

Voltage of negative polarity portion of pulse voltage: 100 V

Frequency of pulse voltage: 500 Hz

Duty ratio of pulse voltage: 50%

Base material: Non-alkali glass base plate or silicon base plate of face (100)

Base material temperature 400° C.

Film thickness: 100 nm

As a comparative example, the conventional device shown in FIG. 5 was used, and a thin film was formed under the conditions listed above except for the impression of pulse voltage. One evaluation was conducted as follows. Concentration of hydrogen contained in a thin film of silicon formed on a silicon base plate was measured by the Fourier transformation infrared spectroscopic method (FT-IR). By this method, concentration of hydrogen contained in the film was determined from the absorption peak integrated intensity of hydrogenated silicon (Si—H) of wave number 2000 $cm^{-1}$. Concentration of hydrogen contained in the film obtained in the comparative example was $2 \times 10^{-22}$ $cm^{-1}$. On the other hand, concentration of hydrogen contained in the thin film obtained in this example was not more than $5 \times 10^{-20}$ $cm^{-3}$. Concentration of hydrogen was greatly reduced, that is, the example was greatly improved as compared with the comparative example.

Another evaluation was conducted as follows. Crystallization of a thin film of silicon formed on the above non-alkali glass base plate was measured by the X-ray diffraction method (XRD) and the Laser Raman spectrometry.

According to XRD, the thin film obtained in the comparative example has an amorphous structure. On the other hand, in the case of the thin film obtained in the example, a peak showing face (111), on which 2θ=28.2°, of cubic structure of silicon was detected, and also a peak showing face (220), on which 2θ=47.2°, of cubic structure of silicon was detected. In this way, crystallization was confirmed. The crystal size was confirmed to be 100 Å to 2000 Å from the half band width of the X-ray diffraction line.

Figure 4:
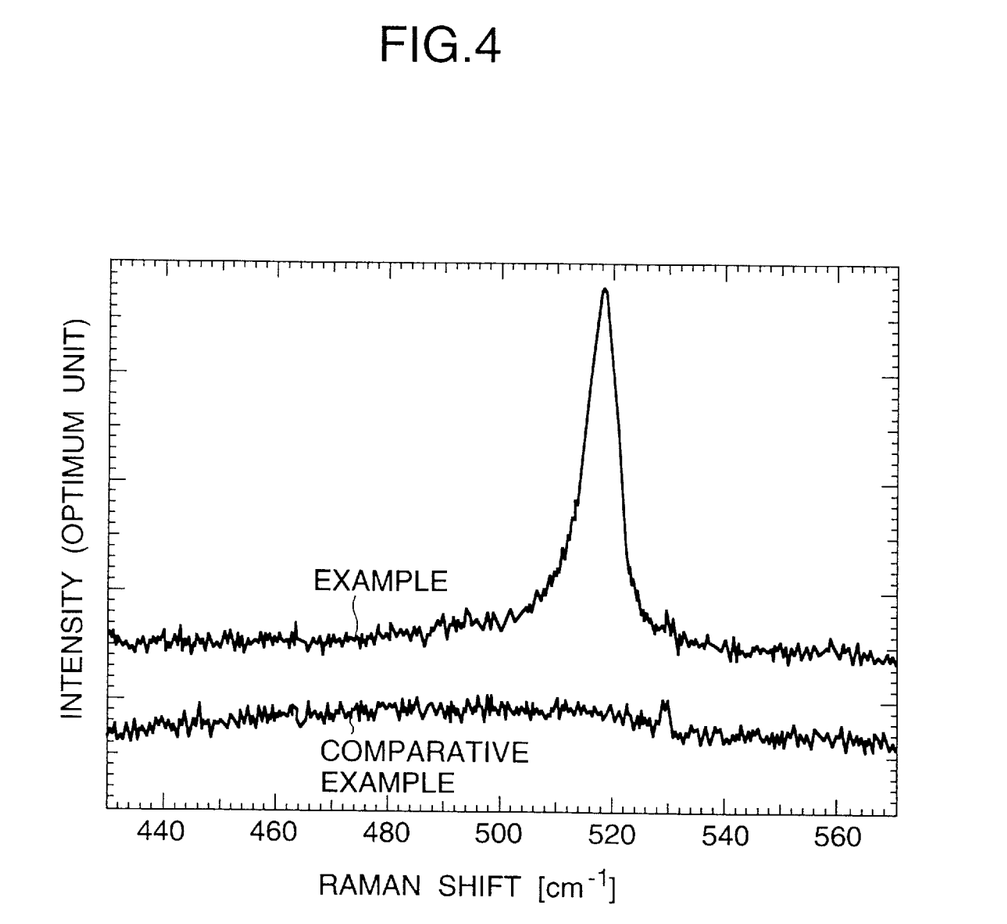
FIG. 4 is a view showing an example of a result of measurement of Raman spectrum of a thin silicon film formed on a glass base plate.

According to the Raman spectrometry, as shown in FIG. 4, the thin film obtained in the comparative example shows a gentle spectrum in which a portion in the proximity of Raman-shift 480 $cm^{-1}$ is a little high, which shows that the thin film has an amorphous structure. On the other hand, in the case of the thin film obtained in the example, a sharp peak appears in the proximity of Raman-shift 515 to 520 $cm^{-1}$, which shows that the thin film of silicon is crystallized.

As described above, according to the present invention, the plasma chamber container is provided separately from the film formation chamber container. Further, the porous electrode is provided for partitioning them from each other. Therefore, the base material in the film formation chamber container can be prevented from being directly exposed to plasma. Further, ions, which have been drawn out by a constant intensity of energy via the porous electrode by the bipolar pulse voltage in the positive polarity cycle, can be made to be incident on the base material. Further, an intensity of energy of ions and a quantity of ions incident on the base material can be controlled by the bipolar pulse voltage, the frequency and the ratio of duty. It is possible to facilitate the crystallization of a thin film formed on the base material by the irradiation of ions. Therefore, an excellently crystalline thin film can be formed without heating the base material to high temperature. As a result, the base material can be selected from a wide range, for example, it is possible to form an excellently crystalline thin film on an inexpensive base material such as a base plate made of low softening point glass. It is possible to form an excellently crystalline thin film only by the film forming process. Therefore, it is possible to omit the two stage processing, which is used in the conventional case, in which heat treatment is conducted after film formation to facilitate crystallization.

Further, when the above bipolar pulse voltage is impressed, electrons can be drawn out from the above plasma in the negative polarity cycle, and the thus drawn electrons can be made to be incident on the base material. Accordingly, a positive electric charge accumulated on the surface of the base material by the irradiation of ions can be neutralized by the electrons. As a result, charge-up (electric charge) of the base material caused by the irradiation of ions can be suppressed. Due to the foregoing, ions incident on the base material can be prevented from being pushed back, that is, it is possible to prevent kinetic energy of ions from being decreased. Accordingly, it becomes possible for ions to be incident on the base material by a predetermined intensity of energy. Therefore, crystallization of a thin film can be more positively facilitated by the irradiation of ions.

What is claimed is:

1. A thin film forming device for forming a silicon thin film having crystallinity comprising:
    a film formation chamber container from which gas is exhausted to vacuum;
    an insulating member;
    a plasma chamber container which is adjacent to the film formation chamber container via the insulating member so that the plasma chamber container is insulated from the film formation chamber container, wherein at least one of raw material gas and a mixture gas containing raw material gas and inert gas is being introduced into the plasma chamber container;
    plasma generation means for generating plasma in the plasma chamber container by ionizing the introduced raw material gas;
    a porous electrode having small pores arranged to partition the plasma chamber container and the film formation chamber container from each other, the electric potential of the porous electrode being the same as that of the plasma chamber container;
    a base material holder for holding a base material so that the base material can be directed to the porous electrode, the base material holder being arranged in the film formation chamber container to be opposed to the porous electrode; and
    a pulse power source for impressing a bipolar pulse voltage, in which a positive polarity portion and a negative polarity portion are alternately repeated, between the base material holder and both the plasma chamber container and the porous electrode.

2. The thin film forming device according to claim 1, wherein the plasma generation means comprises:
    a high frequency electrode arranged in the plasma chamber container, the high frequency electrode being electrically insulated from the plasma chamber container; and
    a high frequency power source for supplying high frequency electric power between the high frequency electrode and the plasma chamber container to generate a high frequency electric discharge between them and ionize the raw material gas.

3. The thin film forming device according to claim 1, wherein the plasma generation means comprises:
    a microwave power source for introducing microwaves into the plasma chamber container to generate a microwave electric discharge in the plasma chamber container and ionize the raw material gas; and
    a microwave introducing means for introducing the microwaves generated by the microwave electric power source into the plasma chamber container.

4. The thin forming device according to claim 1, wherein the frequency of bipolar pulse voltage is in the range of 10 Hz to 1000 Hz.

5. The thin film forming device according to claim 1, wherein the voltage of the positive polarity portion of the bipolar pulse voltage is in the range of 100 V to 1000 V.

6. The thin film forming device according to claim 1, wherein the voltage of the negative polarity portion of the bipolar pulse voltage is in the range of 5 V to 100 V.

7. The thin film forming device according to claim 1, further comprising heating means for heating the base member at 400° C. or less.

8. The thin film forming device according to claim 1, wherein a duty ratio of the bipolar pulse voltage is not lower than 50%.

9. A thin film forming device for forming a thin crystalline film comprising:
    a film formation chamber container;
    an insulating member;
    a plasma chamber container that is adjacent to the film formation chamber container via the insulating member such that the plasma chamber container is insulated from the film formation chamber container;
    plasma generation means for generating plasma in the plasma chamber container by ionizing gas that is introduced into the plasma chamber container;

a base material holder located in the film formation chamber for holding a base material;

a porous electrode that includes small pores, wherein the electric potential of the porous electrode is the same as that of the plasma chamber container and wherein the porous electrode is arranged opposite to the base material holder, and partitions the plasma chamber container and the film formation chamber container from each other to prevent the base material in the film formation chamber container from being directly exposed to the plasma; and a pulse power source for impressing a bipolar pulse voltage, in which a positive polarity portion and a negative polarity portion are alternately repeated between the base material holder and both the plasma chamber container and the porous electrode, wherein the pulse power source assists in forming a thin crystalline film without heating the base material to a high temperature.

10. The thin film forming device according to claim 9, wherein the plasma generation means comprises:

a high frequency electrode arranged in the plasma chamber container, the high frequency electrode being electrically insulated from the plasma chamber container; and a high frequency power source for supplying high frequency electric power between the high frequency electrode and the plasma chamber container to generate a high frequency electric discharge between them and ionize the introduced gas.

11. The thin film forming device according to claim 9, wherein the plasma generation means comprises:

a microwave power source for introducing microwaves into the plasma chamber container to generate a microwave electric discharge in the plasma chamber container and ionize the introduced gas; and a microwave introducing means for introducing the microwaves generated by the microwave electric power source into the plasma chamber container.

12. The thin film forming device according to claim 9, wherein the frequency of bipolar pulse voltage is in the range of 10 Hz to 1000 Hz.

13. The thin film forming device according to claim 9, wherein the voltage of the positive polarity portion of the bipolar pulse voltage is in the range of 100 V to 1000 V.

14. The thin film forming device according to claim 9, wherein the voltage of the negative polarity portion of the bipolar pulse voltage is in the range of 5 V to 100 V.

15. The thin film forming device according to claim 9, further comprising heating means for heating the base member at 400° C. or less.

16. The thin film forming device according to claim 9, wherein a duty ratio of the bipolar pulse voltage is not lower than 50%.

* * * * *

UNITED STATES PATENT AND TRADEMARK OFFICE
CERTIFICATE OF CORRECTION

PATENT NO. : 6,192,828 B1
DATED : February 27, 2001
INVENTOR(S) : Eiji Takahashi et al.

It is certified that error appears in the above-identified patent and that said Letters Patent is hereby corrected as shown below:

<u>Column 10, claim 4,</u>
Line 42, "thin forming" should read -- thin film forming --.

Signed and Sealed this

Second Day of April, 2002

Attest:

JAMES E. ROGAN
*Attesting Officer*  *Director of the United States Patent and Trademark Office*